United States Patent [19]

Yamaguchi et al.

[11] Patent Number: 4,773,943
[45] Date of Patent: Sep. 27, 1988

[54] PHOTOVOLTAIC DEVICE AND A METHOD OF PRODUCING THE SAME

[75] Inventors: Fuminori Yamaguchi; Kenji Tomita, both of Youkaichi, Japan

[73] Assignee: Kyocera Corporation, Kyoto, Japan

[21] Appl. No.: 32,164

[22] Filed: Mar. 30, 1987

[30] Foreign Application Priority Data

| Mar. 31, 1986 | [JP] | Japan | 61-75262 |
| Mar. 31, 1986 | [JP] | Japan | 61-75263 |
| Mar. 31, 1986 | [JP] | Japan | 61-75264 |
| Apr. 29, 1986 | [JP] | Japan | 61-98762 |
| Jul. 31, 1986 | [JP] | Japan | 61-181506 |

[51] Int. Cl.$^4$ ............... H01L 27/14; H01L 31/18
[52] U.S. Cl. ................... 136/244; 136/249; 136/258; 437/2; 437/4; 437/51
[58] Field of Search ........ 136/244, 249 MS, 258 AM; 437/2, 4, 51

[56] References Cited

U.S. PATENT DOCUMENTS

4,532,371 6/1985 Hanak et al. ............... 136/249 MS

FOREIGN PATENT DOCUMENTS

60-144981 7/1985 Japan ............... 136/249 MS

*Primary Examiner*—Aaron Weisstuch
*Attorney, Agent, or Firm*—Spensley Horn Jubas & Lubitz

[57] ABSTRACT

A photovoltaic device including a plurality of power generation regions arranged in alignment with one another on one side of an insulative substrate, the power generation region being composed of an amorphous semiconductor layer, a first electrode formed below the amorphous semiconductor layer, a second electrode formed above the amorphous semiconductor layer, and the first electrode of one of two adjacent power generation regions being electrically connected to the second electrode of the other adjacent power generation region, the photovoltaic device being characterized by connection sections, facing each other with the amorphous semiconductor layer sandwiched between them, the connection sections, being provided on the first electrode of one of two adjacent power generation regions and the second electrode of the other adjacent power generation region, and a straight groove in the amorphous semiconductor layer sandwiched between the connection sections along the arrangement direction of the power generation regions to thereby electrically connect the first electrode of one of two adjacent power generation regions to the second electrode of the other adjacent power generation region so that the effective light-receiving area and output of the photovoltaic device can be increased and the number of process steps and materials can be decreased for cost reduction. The present invention also relates to the production method of the photovoltaic device.

11 Claims, 13 Drawing Sheets

PHOTOVOLTAIC DEVICE AND A METHOD OF PRODUCING THE SAME

BACKGROUND OF THE INVENTION

1. Field of the Invention

The present invention relates to a photovoltaic device to be applied to a solar cell assembly or a photosensor assembly, and more particularly to a photovoltaic device comprising a plurality of power generation regions comprising an amorphous semiconductor layer and the first and second electrodes formed on the top and bottom of the amorphous semiconductor layer, wherein the power generation regions are arranged in alignment with one another on an insulative substrate so that the power generation regions are electrically connected in series along the alignment. Still more particularly, the present invention relates to a method of producing the photovoltaic device.

2. Prior Art

FIG. 12 is a plan view of an example of a conventional photovoltaic device disclosed by Japanese Patent Publication No. 58-21827 (U.S. Pat. No. 4,281,208). FIG. 13 is a sectional view taken on line XIII—XIII in FIG. 12.

Referring to FIGS. 12 and 13, numeral 1 designates an insulative substrate. Numerals 2g–2i designate a plurality of first electrodes formed on the insulative substrate 1. Numeral 3 designates a continuous amorphous semiconductor layer coated on the first electrodes 2g–2i. Numerals 4b–4i designate a plurality of second electrodes coated on the amorphous semiconductor layer 3 and combined with the first electrodes 2g–2i respectively. The first electrodes 2g–i, the amorphous semiconductor layer 3 and the second electrodes 4g–4i are laminated to form and arrange power generation regions g–i in alignment with one another on the insulative substrate 1.

The insulative substrate 1 is made of transparent glass. The first electrodes 2g–2i are made of tin oxide, indium oxide or indium-tin oxide. The amorphous semiconductor layer 3 is made of, for example, an amorphous silicon layer having a P-I-N junction structure to generate electrons and/or holes by light illumination. The second electrodes 4g–4i are made of a metal such as nickel, aluminum, titanium or chromium. These component materials are common to those described in the following descriptions. The power generation regions g–i are electrically connected as described below.

Numerals 21g–21i designate extended connection sections which are extended from the fringes of the first electrodes 2g–2i beyond the boundary of the amorphous semiconductor layer 3. Numerals 41g–41i designate extended connection sections which are extended from the fringes of the second electrodes 4g–4i beyond the *boundary of the amorphous semiconductor layer 3. Among the extended connection sections 41g*–41i of the second electrodes 4g–4i, the extended connection section 41h of the second electrode 4h in the power generation region h is laminated on the extended connection section 21g of the first electrode 2g in the power generation region g. The extended connection section 41i of the second electrode 4i in the power generation region i is laminated on the extended connection section 21h of the first electrode 2h in the power generation region h. The extended connection section 41g of the second electrode 4g in the power generation region g is connected to neither of the extended connection sections 21g–21i of the first electrodes 2g–i, but simply extended beyond the boundary of the amorphous semiconductor layer 3. A lead wire connection terminal 6i is formed on the extended connection section 21i of the first electrode 2i of the power generation region i. As a result, a photovoltaic device including the power generation regions g–i electrically connected in series is made. The electromotive force generated by this device is delivered across the extended connection section 41g of the second electrode 4g in the power generation region g and the lead wire connection terminal 6i formed on the extended connection section 21i of the first electrode 2i in the power generation region i.

Next, a method of producing the photovoltaic device having the structure described above is explained in the order of production process steps referring to FIGS. 14 (a)-(g).

FIG. 14 (a) shows a process step where the insulative substrate 1 is cleaned and dried (the first process step).

In FIG. 14 (b), a first electrode formation mask 22 having windows 22g–22i which in terms of shape and size correspond to the first electrodes 2g–2i and their extended connection sections 21g–21i of the power generation regions g–i is placed on the insulative electrode 1 (the second process step). In this masked condition, transparent conductive film is coated through the windows 22g–22i by a spraying, plasma CVD or sputtering method. When the mask 22 is removed, the first electrodes 2g–2i and their extended connection sections 21g–21i, which are arranged and formed on the substrate 1, are formed as shown in FIG. 14 (c) (the third process step).

As shown in FIG. 14 (d), the insulative substrate 1 is covered with an amorphous semiconductor layer formation mask 32 which has a continuous window 32a provided throughout the first electrodes 2g–2i and a cover section 32b covering all the extended connection sections 21g–21i. The shape and size of the mask 32 is equal to or nearly equal to that of the insulative substrate 1 (the fourth process step). When the masked substrate is placed in a plasma CVD unit, the amorphous semiconductor layer 3 is coated in the area corresponding to the window 32a by glow discharge decomposition. When the mask 32 is removed, the continuous amorphous semiconductor layer 3 is formed to cover the first electrodes 2g–2i as shown in FIG. 14 (e) (the fifth process step).

As shown in FIG. 14 (f), the amorphous semiconductor layer 3 is covered with a second electrode formation mask 42 having windows 42g–42i which in terms of shape and size correspond to the second electrodes 4g–4i and their extended connection sections 41g–41i in the power generation regions g–i and also has a window 42i' which in terms of shape and size corresponds to the lead wire connection terminal 6i (the sixth process step).

In this masked condition, metal film is coated through the windows 42g–42i and 42i' by sputtering, resistance heating or electronic beam method. When the mask 42 is removed, the second electrodes 4g–4i, their extended connection sections 41g–41i and the lead wire connection terminal 6i are formed on the amorphous semiconductor layer 3 as shown in FIG. (g) (the seventh process step).

In the case of the conventional photovoltaic device described above, the connection area (including the connection sections) of the power generation regions g–i is formed like a belt beyond the boundary of the power generation regions as indicated by letter C in FIG. 12. This belt-shaped connection area C occupies 15–20% of the total plane area of the insulative substrate 1. Therefore, the area coated with the amorphous semiconductor layer 3, that is, the ratio of the effective light-receiving area (indicated by letter G in FIG. 12) to the connection area is reduced. Accordingly, when this photovoltaic device is applied to power supply units of pocket calculators and clocks, the size of the insulative substrate 1 becomes large in order to deliver current required for such units. In other words, the output-to-size ratio is small and thus units incorporating such a photovoltaic device are apt to become large. In addition, the connection area C which is useless in photovoltaic effect needs to be covered and puts restrictions on the internal layout of units.

Furthermore, in the case where the conventional photovoltaic device is produced by the above-mentioned process, the mask 32 is used to prevent the amorphous semiconductor layer 3 from entering the connection area C when the amorphous semiconductor layer 3 is coated, as described in the fourth process step. However, it is inevitable that a part of the amorphous semiconductor layer 3 enters the gap between the mask 32 and the insulative substrate 1. Therefore, it is necessary to increase the reliability of the connection between the extended connection sections $21g$–$21i$ of the first electrodes $2g$–$2i$ and the extended connection sections $41g$–$41i$ of the second electrodes $4g$–$4i$. For this purpose, the laminated areas of these extended connection sections need to be made larger. This causes the above-mentioned output-to-size ratio to reduce further. Moreover, due to use of the mask 32, plasma interference is caused by glow discharge when the amorphous semiconductor layer 3 is coated. In particular, interference fringes remain on the amorphous semiconductor layer 3 at the window edges of the mask. As a result, film quality is deteriorated, the output of the photovoltaic device drops and the appearance of application units becomes deteriorated. Moreover, as the mask 32 is subject to repeated use, the mask is deformed. As a result, the positioning accuracy of the mask reduces and the production yield of the photovoltaic devices greatly reduces due to dislocation of the mask.

In the above-mentioned conventional photovoltaic device, the amorphous semiconductor layer 3 is a continuous type provided throughout the power generation regions g-i. In addition to this continuous type, the amorphous semiconductor layer 3 can be a segmented type. This segmented type is made as described below. After a continuous amorphous semiconductor layer is coated and formed throughout a plurality of power generation regions, grooves are formed by irradiation of a laser beam to separate the layer at the boundaries of all the power generation regions and to connect the first electrode of a power generation region to the second electrode of the adjacent power generation region so that separated regions are electrically connected one another.

Segmented types which have been known are disclosed in U.S. Pat. Nos. 4,292,092, 4,542,578, 4,315,096, 4,518,815 and 4,645,866. Among these, U.S. Pat. No. 4,645,866 relates to a prior application by the same assignee as that of the present invention. As a typical example of such a segmented type, the structure and the production method for the photovoltaic device of the prior application are briefly explained referring to FIGS. 15, 16 and 17 (a)–(e).

As shown in FIG. 17 (a), the first electrodes $2g$–$i$ are coated and formed on the insulative substrate 1. On the first electrodes $2g$–$i$, the continuous amorphous semiconductor layer 3 is coated throughout all the power generation regions g-i as shown in FIG. 17 (b). Next, the second electrodes $4g$–$4i$ are coated and formed as a continuous layer on the entire surface of the amorphous semiconductor layer 3 as shown in FIG. 17 (c). By irradiation of a laser beam, the second electrode layers and the amorphous semiconductor layer 3 are removed at the positions where the first electrodes $2g$–$2i$ are adjacent to one another and grooves $7g$–$7i$ are provided to form the independent power generation regions g-i as shown in FIG. 17 (d). Conductive metal paste is filled in the grooves $7g$–$7i$ by printing or other methods as shown in FIG. 17 (e) and is, fired to form conductive connection sections $8g$–$8i$ so that the power generation regions g-i are electrically connected. As the final step, the second electrodes $4g$–$4i$ and the amorphous semiconductor layer 3 are removed by irradiation of a laser beam to form grooves $9g$–$9i$ and to expose the first electrodes $2g$–$2i$. As a result, the power generation regions g-i are connected in series. By following these steps, the photovoltaic device having the structure shown in FIGS. 15 and 16 are produced.

Although the segmented type described above slightly differs from other segmented types in its production process, they are common in that grooves are formed perpendicular to the arrangement direction of a plurality of power generation regions to divide and electrically connect the power generation regions. The connection section of each power generation region of the conventional segmented type photovoltaic device described above can have an area smaller than that of the continuous type photovoltaic device described in the beginning of this specification. Thus the effective light-receiving area of an insulative substrate having a predetermined size can be increased. Due to this structure, the segmented type is advantageous to increase the output-to-size ratio of a power generation device used in application units such as pocket calculators and clocks. In addition, no mask is necessary when the amorphous semiconductor layer is coated. This does not cause problems such as deterioration of film quality, reduction of output due to deterioration and reduction of production yield due to mask deformation caused by repeated use of the mask.

However, in all the above-mentioned conventional segmented type photovoltaic devices, when the number of power generation regions is N, N-1 grooves must be provided by cutting. Conductive metal paste must be filled in the grooves . In this way, considerably large connection sections must be formed and special material must be used at the connection sections. In the case of U.S. Pat. No. 4,645,866 for example, N-1 grooves are additionally necessary to connect the power generation regions in series. Therefore, the number of cutting steps increases and productivity is limited. In addition, special considerations are necessary to ensure the reliability of electrical connection between the conductive metal paste (connection material different from the first and second electrodes) and the first and second electrodes. This also adversely affects productivity.

SUMMARY OF THE INVENTION

It is, therefore, an object of the present invention to provide a photovoltaic device which can have a larger light-receiving area on an insulative substrate having a predetermined size, can deliver higher output and can be composed of the minimum amount of components to reduce cost.

The photovoltaic device of the present invention devised to achieve the above purposes includes a plurality of power generation regions arranged in alignment with one another of one side of an insulative substrate, each power generation region being composed of an amorphous semiconductor layer, a first electrode formed below the amorphous semiconductor layer, a second electrode formed above the amorphous semiconductor layer, and the first electrode of one of two adjacent power generation regions being electrically connected to the second electrode of the other adjacent power generation region, the photovoltaic device being characterized by connection sections, facing each other with the amorphous semiconductor layer sandwiched between them, on the first electrode of one of two adjacent power generation regions and the second electrode of the other adjacent power generation region, and a straght grooves in the amorphous semiconductor layer sandwiched between the connection sections along the alignment direction of the power generation regions to thereby electrically connect the first electrode of one of two adjacent power generation regions to the second electrode of the other adjacent power generation region.

In the case of the photovoltaic device having the structure described above, the areas of the connection sections of the first and second electrodes can be reduced greatly enough to cover the grooves when electrically connecting the power generation regions in series so that their electromotive forces are delivered in series. Therefore, the ratio of the connection area to the entire area of the insulative substrate can be drastically reduced and the effective light-receiving area can be greatly increased. When this photovoltaic device is applied to the power supply units of pocket calculators or clocks, the output-to-size ratio of such electronic units can be greatly increased by making the connection area smaller. In addition, no mask is used when coating the amorphous semiconductor layer. This prevents film quality from being deteriorated since interference fringes due to plasma interference are not caused on the amorphous semiconductor layer. The photovoltaic device can thus deliver stable output and can have better appearance.

Furthermore, since only one straight groove is necessary in the arrangement direction of the power generation regions for electrical connection, the number of process steps can be reduced to a value smaller than that of the above-mentioned conventional segmented type. This can increase productivity. Moreover, the first and second electrodes can be electrically connected to each other without using any special material such as conductive metal paste at the connection sections. Therefore, no special consideration is required for electrical connection. Thus, photovoltaic devices superior in stability of connection can be produced efficiently. The photovoltaic device of the present invention has these superior advantages.

The other purposes and advantages of the present invention will become apparent from the following descriptions.

DETAILED DESCRIPTION OF THE INVENTION

Figure 1:
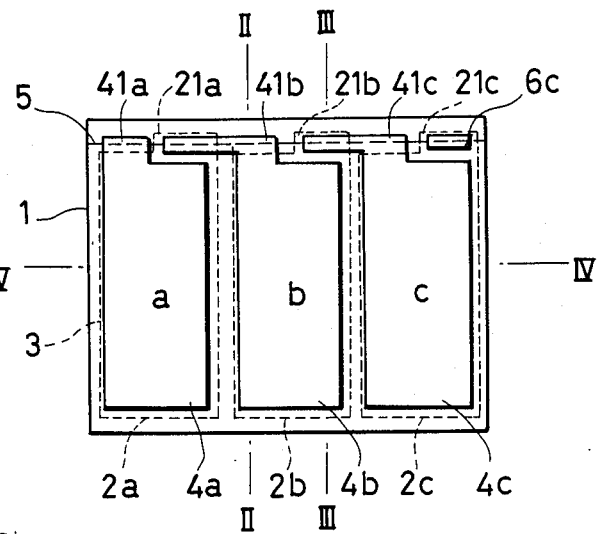
FIG. 1 is a plan view of an embodiment of the photovoltaic device of the present invention.
Figure 2:
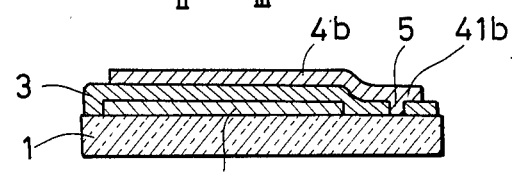
FIG. 2 is a vertical sectional view taken on line II—II in FIG. 1.
Figure 3:
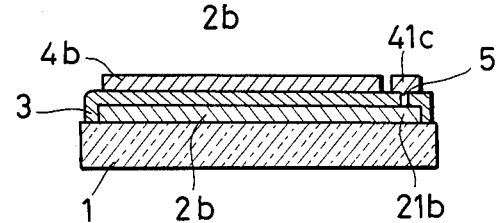
FIG. 3 is a vertical sectional view taken on line III—III in FIG. 1.
Figure 4:
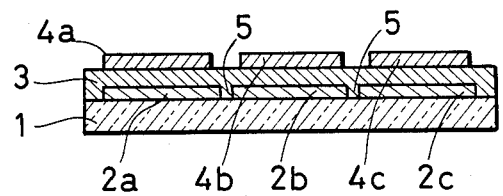
FIG. 4 is a vertical sectional view taken on line IV—IV in FIG. 1.

Referring to FIGS. 1-4, numeral 1 designates an insulative substrate. The insulative substrate 1 is made of transparent glass, ceramic or insulated stainless steel.

Numerals 2a-2c designate first electrodes arranged and formed on almost the entire surface of the insulative substrate 1. Extended connection sections 21a-21c are respectively extended from the first electrodes 2a-2c in the direction perpendicular to the arrangement direction of the first electrodes 2a-2c. The first electrodes 2a-2c and the extended connection sections 21a-21c, are made of transparent conductive film of tin oxide ($SnO_2$), indium tin oxide (ITO), etc. and are formed to have a thickness of 500–1000 Å by a sputtering or plasma CVD method.

Numeral 3 designates an amorphous semiconductor layer 3. This amorphous semiconductor layer 3 is coated on the entire surface of the insulative substrate 1 so that the amorphous semiconductor layer 3 is formed to cover the first electrodes 2a2c and the connection sections 21a-21c. The amorphous semiconductor layer 3 has a P-I-N junction therein so that the layer can generate holes and/or electrons when light is irradiated. The thickness of the P layer is 100–200 Å, the thickness of the I layer is 5000–7000 Å and the thickness of the N layer is 300–700 Å. The entire thickness of the amorphous semiconductor layer is approximately 0.5–0.8 μm.

Numeral 5 designates a straight connection groove formed in a part of the amorphous semiconductor layer 3 along the alignment direction of the extended connection sections 21a–21c of the first electrodes 2a–2c. This connection groove 5 is made by removing a part of the amorphous semiconductor layer 3 so that the first electrodes 2a–2c and the insulative substrate 1 are exposed. The connection groove 5 is formed using a Nd-YAG laser with the Q switching frequency for laser oscillation set at 2 kHz and the scanning speed (relative to the substrate 1) of laser light set at 100 mm/sec. As a result, the connection groove 5 is formed as a straight groove having a width of 50 μm. The width of the connection groove 5, determined by the output of the laser, should be at least 20 μm. The Q switching frequency for laser oscillation and the laser light scanning speed are set to predetermined values so that the first electrodes 2a–2c are not damaged. Small pits having a diameter as small as 20 μm can be formed intermittently. Numerals 4a–4c designate second electrodes. These second electrodes 4a–4c are coated and formed on the amorphous semiconductor layer 3 so that they face the first electrodes 2a–2c with the amorphous semiconductor 3 sandwiched between them. More particularly, the second electrodes 4a–4c are made of nickel (Ni), aluminum, (Al), titanium (Ti) or chromium (Cr) and are formed using a resistance heating or sputtering method.

By the components formed as described above, a plurality of power generation regions a–c are formed and arranged on the insulative substrate 1. When the second electrodes 4a–4c are formed, the extended connection sections 41a–41c of the second electrodes 4a–4c are also formed by masking or etching. These extended connection sections 41b and 41c are connected through the connection groove 5 to the extended connection sections 21a and 21b of the first electrodes 2a and 2b of the power generation regions a and b so that the power generation regions a–c are connected in series. The output of the photovoltaic device having the power generation regions a–c connected in series as described above is delivered across the extended connection section 41a of the second electrode 4a of the power generation region a and the output terminal 6c formed on the connection groove 5 where the first electrode 2c of the power generation region c is exposed.

Since the resistance between the two adjacent power generation regions is larger than that of the resistance in the direction of the thickness of the amorphous semiconductor layer 3, the leakage current of the series connection of the power generation regions a–c is negligible even though the amorphous semiconductor layer 3 is formed throughout the power generation regions a–c.

The inventors confirmed that no problem occurred when an output current was approximately 20 μA if the width of the connection groove 5 was at least approximately 20 μm. As a result, the connection area of the device can be made very small and thus an insulative substrate 1 having an effective area of more than 90% can be designed very easily. In addition, the power generation regions a–c can be easily connected electrically in series by simply forming only one straight connection groove 5 in the arrangement direction of the power generation regions a–c.

The inventors compared the output characteristics of the photovoltaic device of the present invention with those of the conventional photovoltaic device by measuring the output values of the two devices having first and second electrodes of the same dimensions and shapes under the same conditions. As a result of the measurement, the inventors confirmed that the short-circuit current Isc of the photovoltaic device of the present invention was larger than that of the conventional photovoltaic device by approximately 10–15%. This is obtained because the effective light-receiving area of the insulative substrate 1 is increased and the amorphous semiconductor layer 3 is not damaged by mask interference and thus the quality of the amorphous semiconductor layer 3 is made uniform since no mask is used when the amorphous semiconductor layer 3 is coated on the entire surface of the insulative substrate 1.

The production method of the photovoltaic device having the structure of the above-mentioned embodiment is detailed below.

Figure 5:
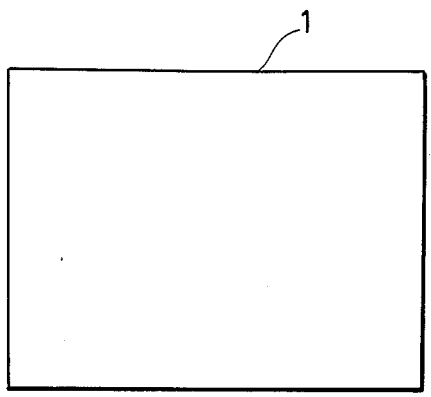
FIGS. 5 (a)-(g) are plan views illustrating the production process steps of the photovoltaic device shown in FIG. 1.
Figure 5:
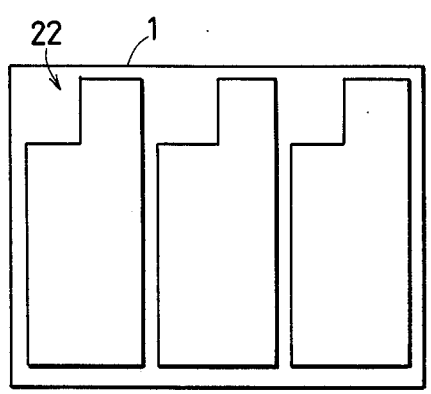
Figure 5:
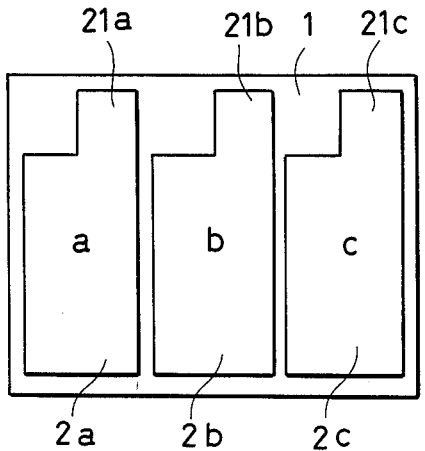
Figure 5D:
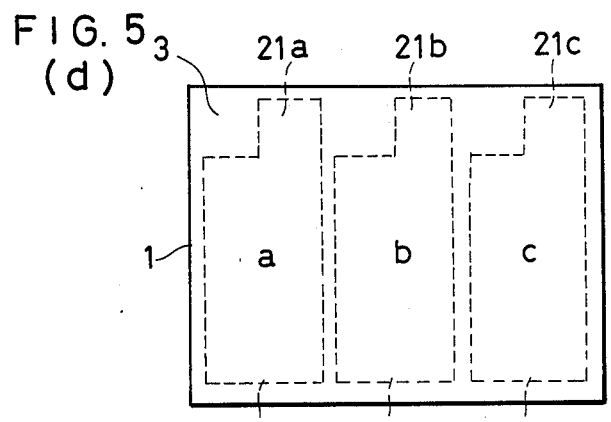
Figure 5E:
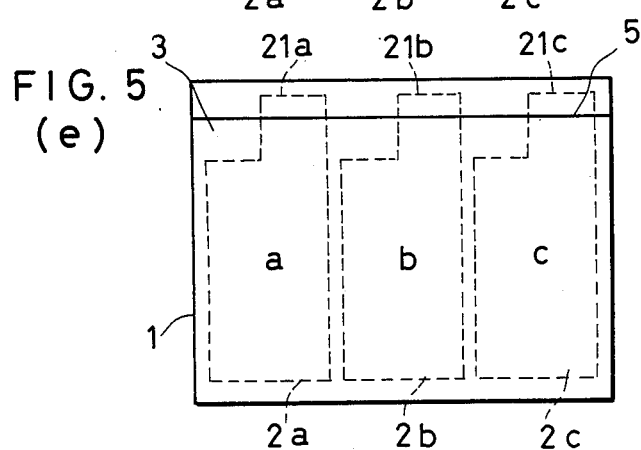
Figure 5F:
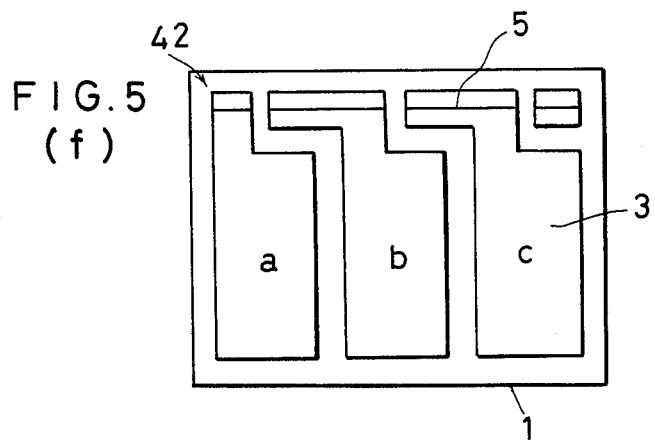
Figure 5:
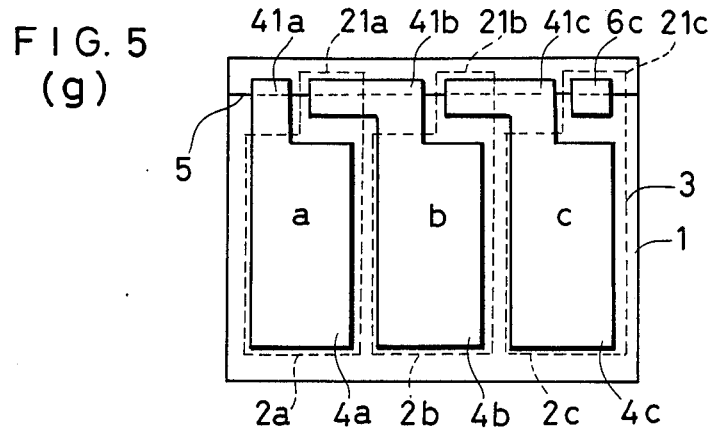

The insulative substrate 1 made of glass, ceramic or insulated stainless steel is cleaned and dried [FIG. 5 (a)]. The first electrode formation mask 22 is placed on the insulative substrate 1 [FIG. 5 (b)]. This mask has windows which have the predetermined shapes corresponding to the first electrodes 2a–2c and their extended connection sections 21a–21c of the power generation regions a–c.

In this condition, transparent conductive film, such as tin oxide ($SnO_2$), which is the material of the first electrodes 2a–2c and their extended connection sections 21a–21c, is coated using a spraying, plasma CVD or sputtering method. The mask 22 is then removed and the first electrodes 2a–2c and their extended connection sections 21a–21c having the predetermined shapes are formed and arranged on the insulative substrate 1 [FIG. 5 (c)].

The insulative substrate 1 on which the first electrodes 2a–2c have been coated is then placed in a plasma CVD unit and the amorphous semiconductor layer 3 is coated on the entire surface of the insulative substrate 1 by glow discharge decomposition [FIG. 5 (d)].

The amorphous semiconductor layer 3 is made of amorphous silicon having a P-I-N junction therein. The P layer of the junction is formed by introducing a gas mixture of silane, hydrogen and diborane (P-type semiconductor doping agent) and by applying a high-frequency voltage (13.56 MHz) with the substrate 1 heated to 150°–200° C. and the gas pressure maintained at 1.0–1.3 Torr. The I layer is formed and coated using silane. The N layer is formed and coated using a gas mixture of silane, hydrogen and phosphine (N-type semiconductor doping agent). The thickness of the amorphous semiconductor layer 3 is 0.5–1 μm.

Next, by irradiating a laser, the straight connection groove 5 is formed in a part of the amorphous semiconductor layer 3 on the extended connection sections 21a–21c of the first electrodes 2a–2c on the insulative substrate 1 in the alignment direction of the extended connection sections 21a– 21c [FIG. 5 (e)]. This connection groove 5 passes through the amorphous semiconductor layer 3 so that the extended connection sections 21a–21c of the first electrodes 2a–2c and the insulative, substrate 1 are exposed. To form the connection groove 5, a Nd-YAG laser is irradiated for example at a Q switching frequency for laser oscillation of 2 KHz and a laser scanning speed (relative to the insulative substrate 1) of 100 mm/sec. The second electrode formation mask 42, which has windows having predetermined shapes corresponding to the second electrodes 4a–4c, extended connection sections 41a–41c of the second electrodes 4a–4c and the output terminal 6c, is placed on the amorphous semiconductor layer 3 [FIG. 5 (f)].

In this condition, a metal film is coated to form the second electrodes 4a–4c, the extended connection sections 41a–41c of the second electrodes 4a–4c and the output terminal 6c by a sputtering, resistance heating or electron beam method. The metal film is made of aluminum, nickel, chromium, titanium, etc. and the thickness of the metal film is 0.4–1 μm.

Even if the thickness of the metal film is smaller than that of the amorphous semiconductor layer 3, improper connection does not occur at the edges of the connection groove 5 by turning the insulative substrate 1 while the metal film is coated.

When the mask 42 is removed, the second electrodes 4a–4c, the extended connection sections 41a–41c of the second electrodes and the output terminal 6c, all of which have predetermined shapes, are formed. Via the connection groove 5, the extended connection section 21a of the first electrode 2a of the power generation region a is electrically connected to the extended connection section 41b of the second electrode 4b of the power generation region b. In the same way, the extended connection section 21b of the first electrode 2b of the power generation region b is electrically connected to the extended connection section 41c of the second electrode 4c of the power generation region c. As a result, the power generation regions a–c are connected in series as shown in FIG. 5 (g) to form a photovoltaic device.

According to the present invention, the area where the electrical connection is actually performed is the connection groove having an opening 20–200 μm wide. Therefore, the extended connection sections 21a and 21b of the first electrodes 2a and 2b and the extended connection sections 41b and 41c of the second electrodes 4b and 4c are only required to have widths slightly larger than the width of the connection groove 5. The connection area of the photovoltaic device can thus be greatly reduced.

Figure 6:
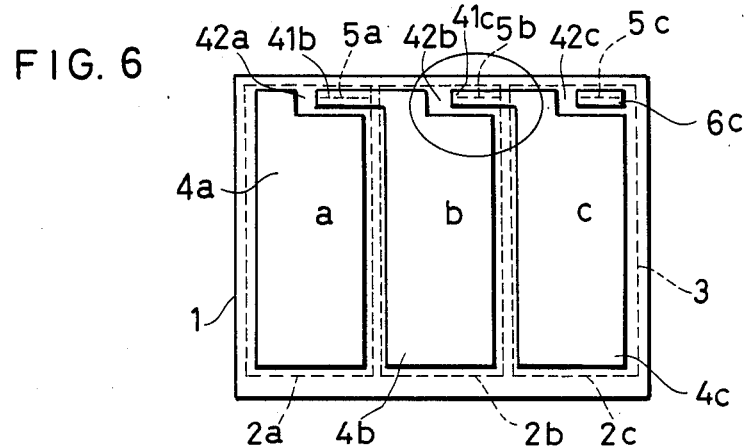
FIG. 6 is a plan view of another embodiment of the photovoltaic device of the present invention.

FIG. 6 shows another embodiment of the photovoltaic device of the present invention. This embodiment differs from the above-mentioned embodiment in that the first electrodes 2a–2c formed and arranged on the insulative substrate 1 have rectangular shapes formed on almost the entire width of the insulative substrate 1 and have no extended connection section, that connection grooves 5a–5c are formed intermittently along a straight line, that the second electrodes 4a–4c have notches 42a–42c so that the connection grooves 5a–5c are exposed, and that the extended connection sections 41b and 41c of the second electrodes 4b and 4c of the two adjacent power generation regions b and c and the output terminal 6c of this embodiment are inserted in the notches 42a–42c. In other respects, this embodiment shown in FIG. 6 is the same as the above-mentioned embodiment.

Figure 7:
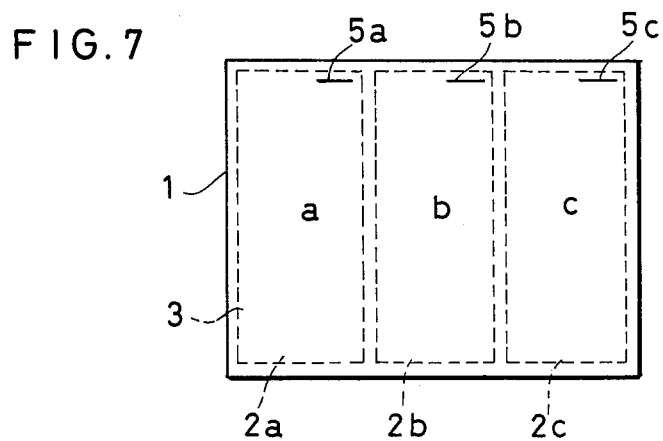
FIG. 7 is a plan view illustrating the main production process step of the photovoltaic device shown in FIG. 6.

FIG. 7 showing the main production process step of the photovoltaic device of the embodiment shown in FIG. 6 is given mainly to explain the differences from the production process steps of the embodiment shown in FIGS. 1–4. The differences are briefly described as follows.

The rectangular first electrodes 2a–2c are formed and arranged on the insulative substrate 1. The first electrodes 2a–2c have no connection section and are formed on almost the entire surface of the insulative substrate 1. On these first electrodes 2a–2c, the continuous amorphous semiconductor layer 3 is formed. On this amorphous semiconductor layer 3, the straight connection grooves 5a–5c are formed intermittently along the arrangement direction of the first electrodes 2a–2c. The connection grooves 5a–5c should be provided near the ends of the first electrodes 2a–2c to increase the effective light-receiving area of the embodiment.

Figure 8:
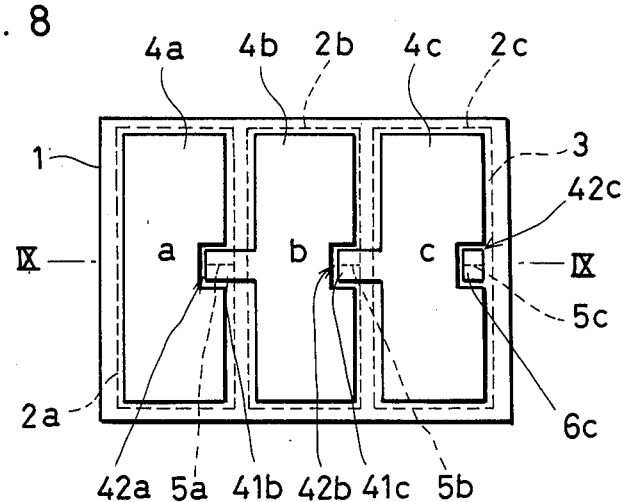
FIG. 8 is a plan view of a third embodiment of the photovoltaic device of the present invention.
Figure 9:
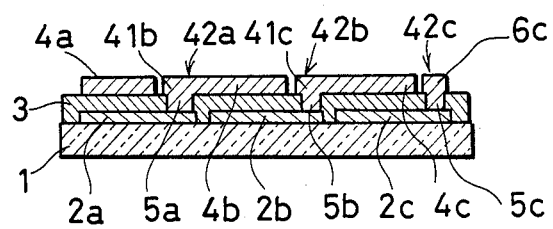
FIG. 9 is a vertical sectional view taken on line IX—IX in FIG. 8.

FIGS. 8 and 9 show a third embodiment of the present invention. The main points of this embodiment are explained below.

The first electrodes 2a–2c are formed and arranged on the insulative substrate 1 and on these first electrodes 2a–2c, the continuous amorphous semiconductor layer 3 is coated and formed. On this amorphous semiconductor layer 3, the straight connection grooves 5a–5c are formed intermittently along the alignment direction of the first electrodes 2a–2c at the positions close to the crosswise centers of the power generation regions a–c.

On the amorphous semiconductor layer 3, the second electrodes 4a–4c are formed to respectively face the first electrodes 2a–2c with the amorphous semiconductor layer 3 sandwiched between them and the notches 42a–42c of this embodiment are provided so that the connection grooves 5a–5c are exposed. In this way, the power generation regions a–c are formed on the insulative substrate 1.

When the second electrodes 4a–4c are formed, the extended connection sections 41b and 41c, which extend to the notches 42a and 42b of the two adjacent power generation regions a and b are also formed. As a result, the first electrode 2a of the power generation region a is connected to the extended connection section 41b of the second electrode 4b of the power generation region b via the connection groove 5a. The first electrode 2b of the power generation region b is also connected to the extended connection section 41c of the second electrode 4c of the power generation region c via the connection groove 5b. In this way, the power generation regions a–c are connected in series. By this connection, the output of the photovoltaic device having the power generation regions a–c connected in series is delivered across the second electrode 4a of the power generation region a and the output terminal 6c formed on the connection groove 5c where the first electrode 2c is exposed at the notch 42c of the power generation region c.

In the case of this photovoltaic device having the structure described above, the sections used to electrically connect the power generation regions a–c in series are located almost at the center of each power generation region. Therefore, the loss due to the resistance of the electrode sheet can be minimized to allow the holes and/or electrons collected at the fringes of the first electrodes 2a–2c and the second electrodes 4a–4c to move smoothly. In this way, proper electrical connection is obtained.

Figure 10:
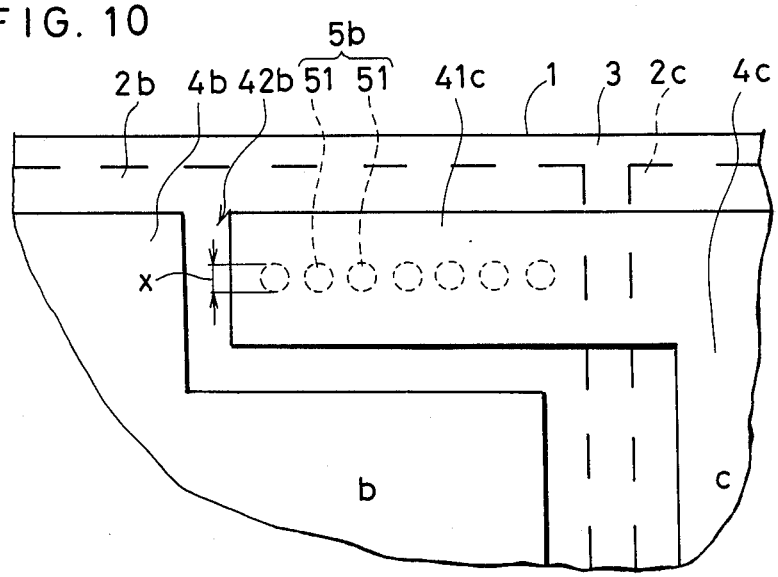
FIG. 10 is an enlarged plan view of the main section of a fourth embodiment of the photovoltaic device of the present invention.

FIG. 10 shows an enlarged view of the connection section of a fourth embodiment of the photovoltaic device of the present invention. The connection section corresponds to the encircled portion shown in FIG. 6.

The first electrodes 2a–2c, the amorphous semiconductor layer 3, the second electrodes 4a–4c and the output terminal 6c of this embodiment are the same as those of the photovoltaic device shown in FIGS. 1–4 in terms of structure and shape, and are not detailed here.

The second electrode 4c of the power generation region c has the extended connection section 41c which is extended to the notch 42b of the power generation region b. The first electrode 2b of the power generation region b faces the extended connection section 41c of the second electrode 4c of the power generation region c with the amorphous semiconductor layer 3 sandwiched between them. The amorphous semiconductor layer 3 has a connection groove 5b comprising a plurality of holes 51... arranged as shown in FIG. 10 at the area where the first electrode 2b of the power generation region b faces the extended connection section 41c. By this structure, the extended connection section 41c of the power generation region c is electrically connected to the first electrode 2b of the power generation region b via the connection groove 5b.

The connection grooves 5b comprising the above-mentioned holes 51... are formed using Nd-YAG laser with the Q switching frequency for laser oscillation set at 2 kHz and the scanning speed (relative to the substrate 1) of the laser light set at 200 mm/sec. As a result, the connection groove 5b comprising the holes 51... having a diameter of 50 $\mu$m arranged as shown in the figure is formed.

The inventors produced 21 photovoltaic devices, each having four power generation regions connected in series on a production-use glass substrate of 10 cm square and measured the output characteristics of the photovoltaic devices under the same conditions as those used for measurement of the conventional photovoltaic devices. The results of the measurement are shown in Table 1.

| Sample number | Open circuit voltage (Voc) | Fill Factor (FF) |
|---|---|---|
| 1 | 2.59 | 0.73 |
| 2 | 2.69 | 0.78 |
| 3 | 2.66 | 0.81 |
| 4 | 2.63 | 0.79 |
| 5 | 2.66 | 0.78 |
| 6 | 2.66 | 0.79 |
| 7 | 2.59 | 0.79 |
| 8 | 2.62 | 0.77 |
| 9 | 2.66 | 0.79 |
| 10 | 2.66 | 0.77 |
| 11 | 2.67 | 0.76 |
| 12 | 2.69 | 0.79 |
| 13 | 2.69 | 0.76 |
| 14 | 2.54 | 0.79 |
| 15 | 2.64 | 0.79 |
| 16 | 2.66 | 0.81 |
| 17 | 2.59 | 0.80 |
| 18 | 2.62 | 0.77 |
| 19 | 2.70 | 0.77 |
| 20 | 2.64 | 0.67 |
| 21 | 2.58 | 0.80 |

As clearly understood by referring to Table 1, the open circuit voltage Voc has a stable high value of 2.54–2.70V. The fill factor (FF) also has a very high value of more than 0.75 except for samples No. 1 and 20. Even the average fill factor (FF) value of 21 photovoltaic devices is a very high value of more than 0.77. The calculated maximum output values of 12 of the photovoltaic devices (more than half the number of them) exceed 29.0 $\mu$W.

In the above-mentioned embodiment, the connection groove 5b comprises the holes 51... having a diameter of 50 $\mu$m. Holes having a diameter of at least approximately 20 $\mu$m can allow electric current of approximately 20 $\mu$A to flow smoothly. If the diameter a is more than 200 $\mu$m the laser irradiation, energy increases excessively at the center of each hole. It is understood that this may remove some parts of the first electrodes 2a–2c and seriously damage the amorphous semiconductor layer 3, resulting in a short-circuit or improper continuity.

Figure 11A:
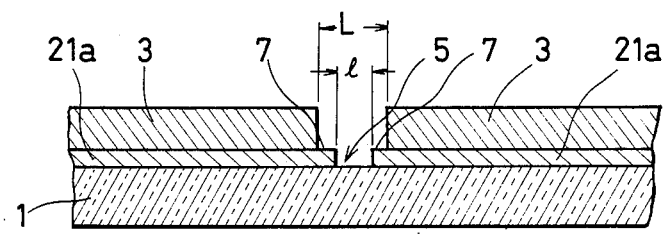
FIGS. 11 (a) and (b) are enlarged vertical sectional views of the main section of a fifth embodiment of the photovoltaic device of the present invention.
Figure 11B:
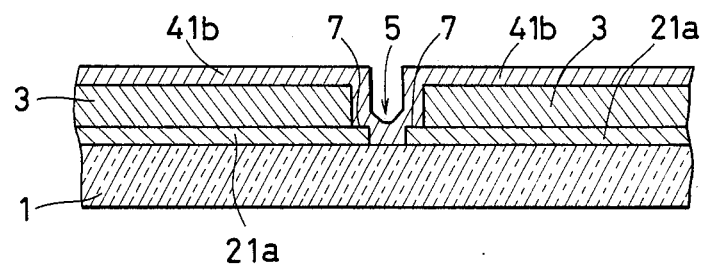
Figure 12:
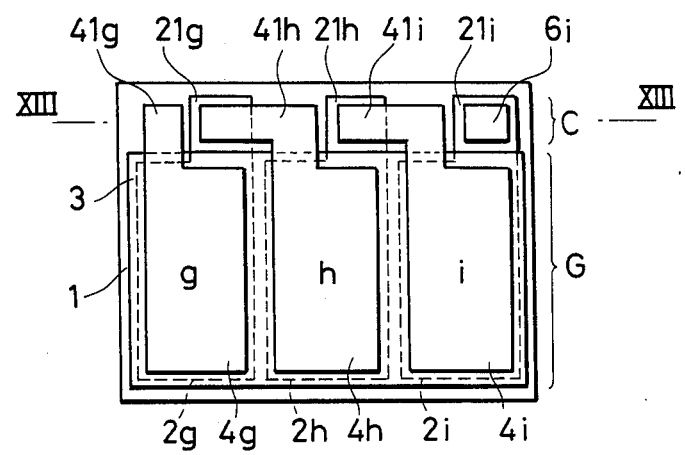
FIG. 12 is a plan view of a conventional photovoltaic device.
Figure 13:
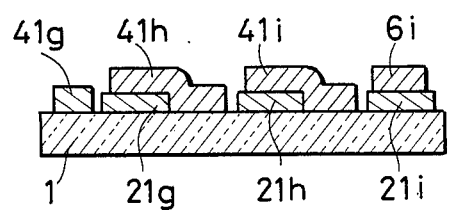
FIG. 13 is a vertical sectional view taken on line XIII—XIII in FIG. 12.
Figure 14A:
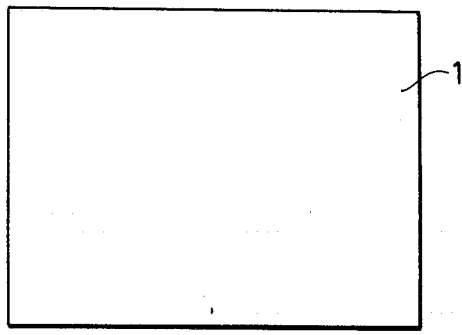
FIGS. 14 (a)-(g) are plan views illustrating the production process steps of the photovoltaic device shown in FIG. 12.
Figure 14B:
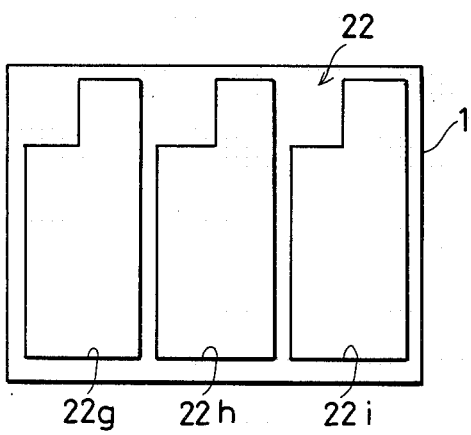
Figure 14C:
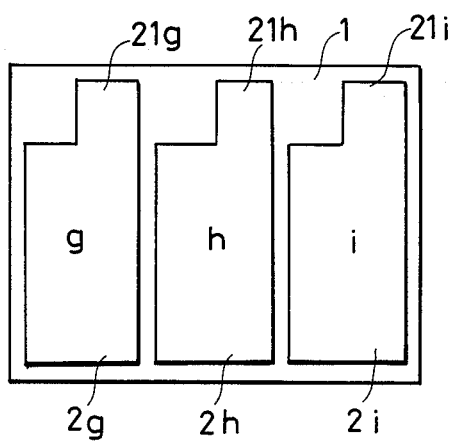
Figure 14D:
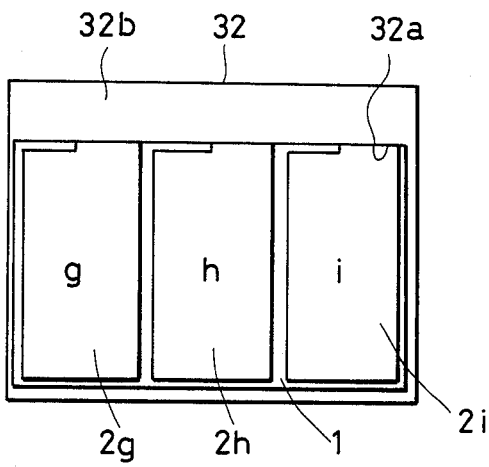
Figure 14E:
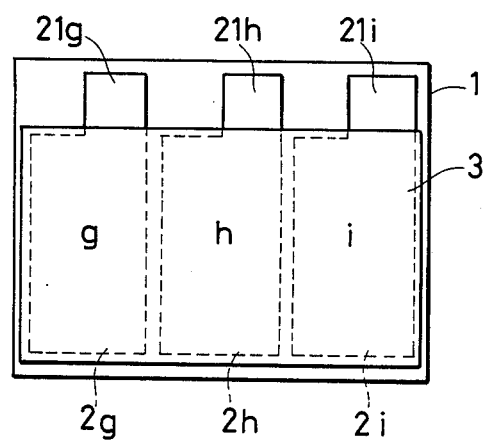
Figure 14F:
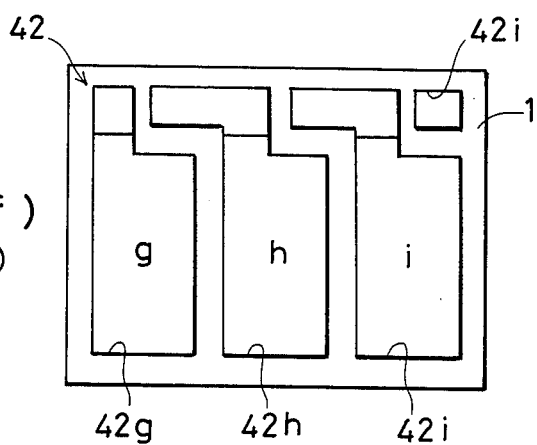
Figure 14G:
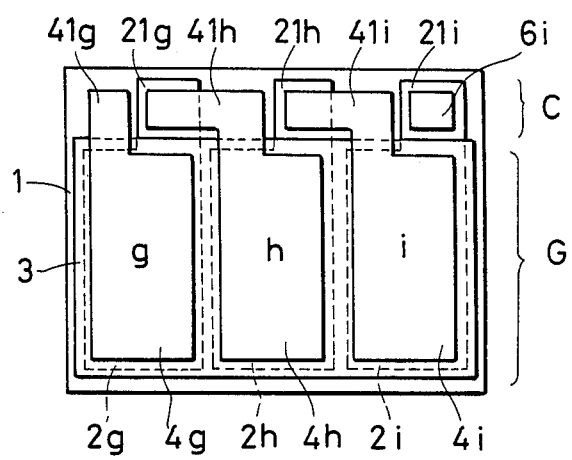
Figure 15:
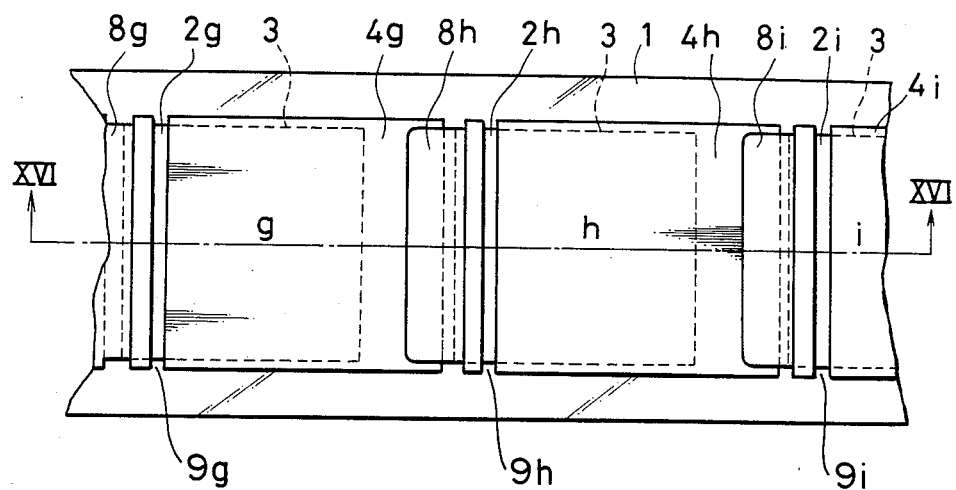
FIG. 15 is a plan view of a conventional segmented type photovoltaic device.
Figure 16:
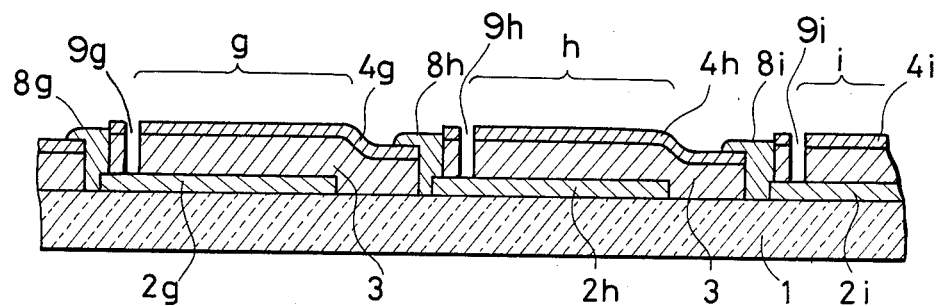
FIG. 16 is a vertical sectional view taken on line XVI—XVI in FIG. 15.
Figure 17A:
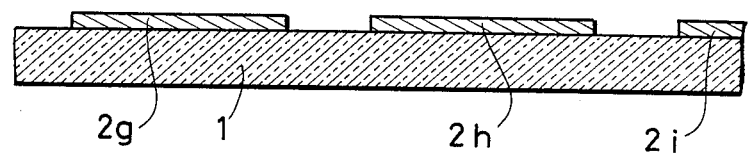
FIGS. 17 (a)-(e) are vertical sectional views illustrating the production process steps of the photovoltaic device shown in FIG. 15.
Figure 17B:
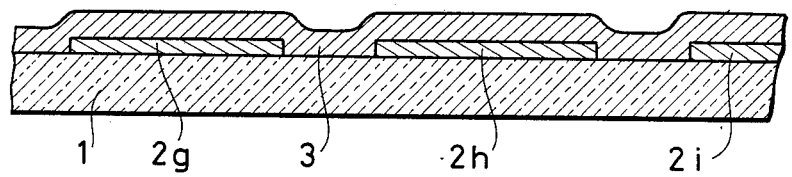
Figure 17C:
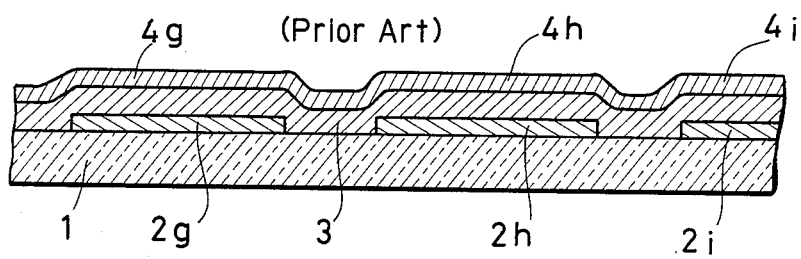
Figure 17D:
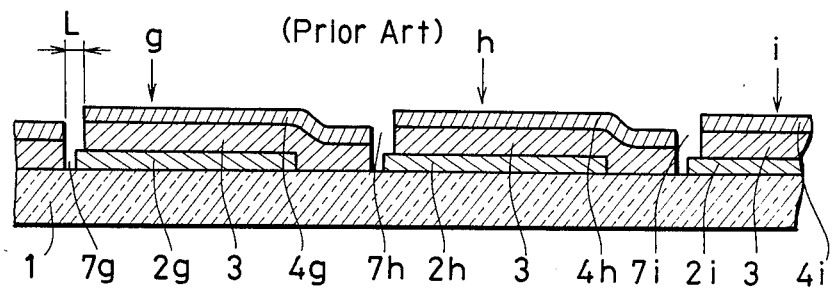
Figure 17E:
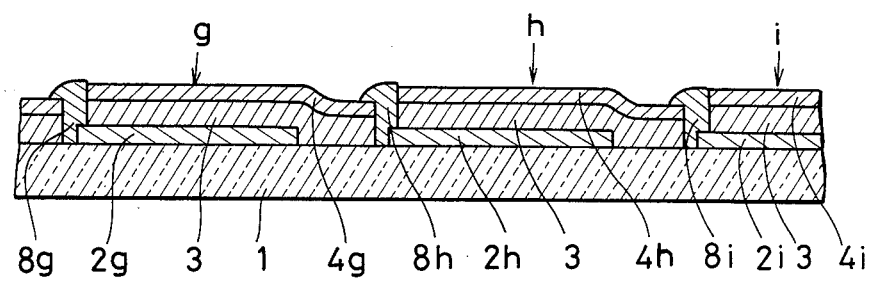

FIGS. 11 (a) and 11 (b) are enlarged sectional views of a fifth embodiment of the photovoltaic device of the present invention. This embodiment features a connection groove 5 formed as detailed below. As shown in FIG. 11 (a), a Nd$^{3+}$+YAG laser having a wavelength of 1.06M is irradiated over the amorphous semiconductor layer 3 to remove the extended connection section 21a of the first electrode 2a and to form the connection groove 5 which reaches the surface of the substrate 1. The groove 5 formed as described above has a stepped form. The width L of the groove 5 formed in the amorphous semiconductor layer 3 is 100–200 $\mu$m and the width 1 of the groove 5 formed in the extended section 21a of the first electrode 2a is 50–100 $\mu$m. The groove 5 of this shape can be obtained by using a condensing optical system instead of an image formation optical system when the laser is irradiated. More particularly, the output intensity of the condensing optical system has a curve of secondary degree and laser light of 1.06M is not sufficiently absorbed by the amorphous semiconductor layer 3 but is first absorbed by the extended connection section 21a of the first electrode 2a. Due to the heat generated at this time, the amorphous semiconductor layer 3 is removed beginning with the position aligned with the center of the laser light. The removal area gradually expands from the position to the surrounding area. Next, as shown in FIG. 11 (b), the extended cohnection section 41b of the second electrode 4b is formed on the amorphous semiconductor layer 3 having the groove 5 so that the extended connection section 41b is electrically connected to the extended connection section 21a of the first electrode 2a.

In the case of this embodiment, a step section 7 of the extended connection section 21a of the first electrode 2a can be seen when the groove 5 is viewed from its open side. In this groove 5, the extended connection section 41b of the second electrode 4b is filled. In addition to the connection section in the direction of thickness, the continuity area of the extended section 41b is expanded to the step section 7. More particularly, the continuity area expands from the section having a thickness of 1 $\mu$m to 25–27 $\mu$m on one side of the step section 7 of the groove 5. The photovoltaic device having this structure can have a very large continuity area in the groove 5 and junction is carried out at the flat portion of the step 7. Therefore, the reliability of continuity can be greatly increased.

In all the embodiments described above, transparent conductive film is used to form the first electrodes and metal film is used to form the second electrodes. Inversely, metal film can used to form the first electrodes and transparent conductive film can be used to form the second electrodes. In addition, instead of using masks to form the first and second electrodes, resist film and etching can be used to form the first and second electrodes having predetermined shapes.

We claim:

1. A photovoltaic device including a plurality of power generation regions arranged in alignment with one another on one side of an insulated substrate, each said power generation region comprising an amorphous semiconductor layer, a first electrode formed below said amorphous semiconductor layer, a second electrode formed above said amorphous semiconductor layer, and said first electrode of one of two adjacent power generation regions being electrically connected to said second electrode of the other adjacent power generation region, said photovoltaic device being characterized by connection sections, facing each other with said amorphous semiconductor layer sandwiched between them, said connection sections being provided on said first electrode of one of two adjacent power generation regions and on said second electrode of the other adjacent power generation region, and a straight groove in said amorphous semiconductor layer sandwiched between said connection sections along the alignment direction of said power generation regions to thereby electrically connect said first electrode of one of two adjacent power generation regions to said second electrode of the other adjacent power generation region.

2. A photovoltaic device according to claim 1, wherein said connection section of said first electrode and said connection section of said second electrode, facing each other with said amorphous semiconductor layer sandwiched between said connection sections, are extended respectively from said first and second electrodes in the direction perpendicular to the alignment direction of said power generation regions.

3. A photovoltaic device according to claim 1, wherein said connection section of said second electrode, facing said connection section of said first electrode with said amorphous semiconductor layer sandwiched between said connection sections, is put in a notch formed in said second electrode of said adjacent power generation region to face said connection section of said first electrode of said adjacent power generation region.

4. A photovoltaic device according to claim 1, 2 or 3, wherein said groove is formed continuously along said alignment direction of said power generation regions in the areas of said amophous semiconductor layer where said connection sections are provided.

5. A photovoltaic device according to claim 1, 2 or 3, wherein said groove is intermittently formed in the areas of said amorphous semiconductor layer where said groove faces said connection sections.

6. a photovoltaic device according to claim 1, 2 or 3, wherein the width of said groove formed in said amorphous semiconductor layer is wider than the width of said groove formed in said first electrode so that said groove has a step section which exposes said first electrode.

7. a photovoltaic device according to claim 1 wherein said groove is formed by laser irradiation.

8. A method of producing a photovoltaic device comprising a step of coating a plurality of spaced apart first electrodes in alignment with one another on one side of an insultive substrate, a step of continuously coating an amorphous semiconductor layer to cover said plurality of said first electrodes, a step of forming a straight groove, said groove passing through said amorphous semiconductor layer along the alignment direction of said first electrodes, and a step of coating and forming a plurality of spaced apart second electrodes on said amorphous semiconductor layer so that said second electrode of one of two adjacent power generation regions is electrically connected to said first electrode of the adjacent power generation region.

9. A method of producing a photovoltaic device according to claim 8, wherein said groove is formed by providing a plurality of holes along a line.

10. A method of producing a photovoltaic device according to claim 8 or 9, wherein said groove is formed in said amorphous semiconductor layer so that the width of said groove is wider than the width of said groove in said first electrode.

11. A method of producing a photovoltaic device according to claim 8 wherein said groove is formed by laser irradiation.

* * * * *